US008450216B2

United States Patent
Teo et al.

(10) Patent No.: US 8,450,216 B2
(45) Date of Patent: May 28, 2013

(54) CONTACT ETCH STOP LAYERS OF A FIELD EFFECT TRANSISTOR

(75) Inventors: Lee-Wee Teo, Singapore (SG); Ming Zhu, Singapore (SG); Bao-Ru Young, Zhubei (TW); Harry-Hak-Lay Chuang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 261 days.

(21) Appl. No.: 12/849,601

(22) Filed: Aug. 3, 2010

(65) Prior Publication Data

US 2012/0032238 A1 Feb. 9, 2012

(51) Int. Cl.
*H01L 21/302* (2006.01)

(52) U.S. Cl.
USPC ........... 438/740; 438/655; 438/233; 438/620; 438/621; 438/622; 438/623; 438/624; 257/E21.625; 257/E21.5; 257/E21.501; 257/E21.593

(58) Field of Classification Search
USPC ....... 257/E29.156, E21.625, E21.5, E21.501, 257/E21.593; 438/655, 233, 620, 621, 622, 438/623, 624, 740
See application file for complete search history.

(56) References Cited

U.S. PATENT DOCUMENTS 7,737,510 B2 * 6/2010 Akamatsu ...................... 257/408
2009/0321795 A1 * 12/2009 King et al. ...................... 257/288

FOREIGN PATENT DOCUMENTS

CN 101872742 10/2010

OTHER PUBLICATIONS

Office Action dated Dec. 27, 2012 from corresponding application No. CN 201110038163.5.

* cited by examiner

*Primary Examiner* — Julio J Maldonado
*Assistant Examiner* — Hajar Kolahdouzan
(74) *Attorney, Agent, or Firm* — Lowe Hauptman Ham & Berner, LLP (57) ABSTRACT

An exemplary structure for a field effect transistor according to at least one embodiment comprises a substrate comprising a surface; a gate structure comprising sidewalls and a top surface over the substrate; a spacer adjacent to the sidewalls of the gate structure; a first contact etch stop layer over the spacer and extending along the surface of the substrate; an interlayer dielectric layer adjacent to the first contact etch stop layer, wherein a top surface of the interlayer dielectric layer is coplanar with the top surface of the gate structure; and a second contact etch stop layer over the top surface of the gate structure.

20 Claims, 7 Drawing Sheets

CONTACT ETCH STOP LAYERS OF A FIELD EFFECT TRANSISTOR

TECHNICAL FIELD

The disclosure relates to integrated circuit fabrication, and more particularly to a field effect transistor with contact etch stop layers.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in complementary metal-oxide-semiconductor (CMOS) fabrication. As the gate length and spacing between devices decrease, these problems are exacerbated. For example, recess in a metal gate structure may be generated during contact etching due to low etch selectivity between the metal gate structure and a contact etch stop layer. Accordingly, what is needed is an improved device and method of metal gate structure protection.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure provides examples based on a "gate last" metal gate structure, however, one skilled in the art may recognize applicability to other structures and/or use of other materials.

Figure 1:
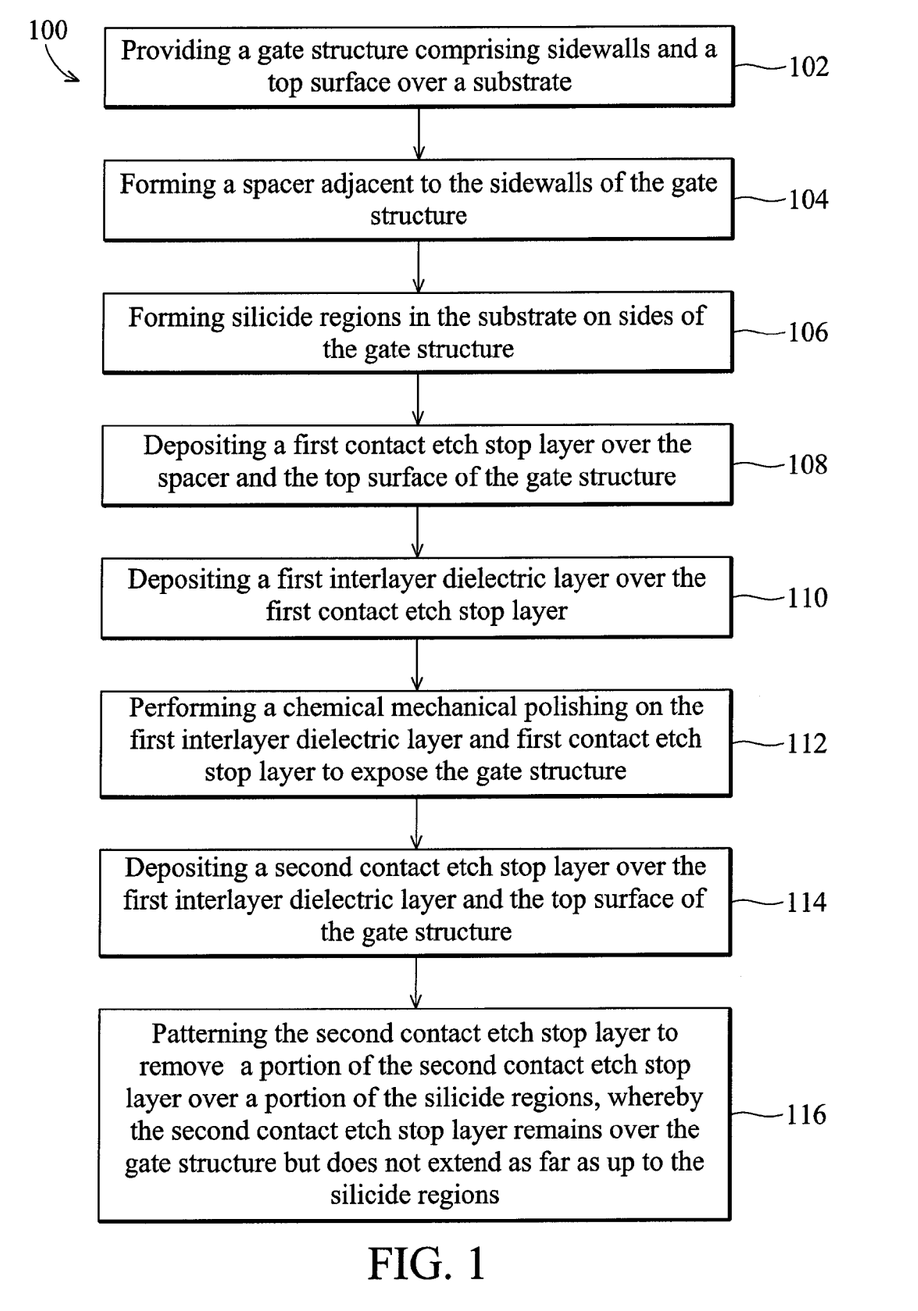
FIG. 1 is a flowchart illustrating a method for fabricating a field effect transistor comprising contact etch stop layers according to various aspects of the present disclosure.

FIG. 1 is a flowchart illustrating a method 100 for fabricating a field effect transistor 200 comprising contact etch stop layers 224, 234 (shown in FIGS. 2C through 2H) according to various aspects of the present disclosure. FIGS. 2A-H show schematic cross-sectional views of contact etch stop layers 224, 234 of a field effect transistor 200 at various stages of fabrication according to various aspects of the present disclosure. The field effect transistor of FIG. 1 may be further processed using CMOS technology processing. Accordingly, it is understood that additional processes may be provided before, during, and after the method 100 of FIG. 1, and that some other processes may only be briefly described herein. Also, FIGS. 1 through 2H are simplified for a better understanding of the inventive concepts of the present disclosure. For example, although the figures illustrate the contact etch stop layers 224, 234 of a field effect transistor 200, it is understood the field effect transistor may be part of an IC that further comprises a number of other devices such as resistors, capacitors, inductors, fuses, etc.

Figure 2A:
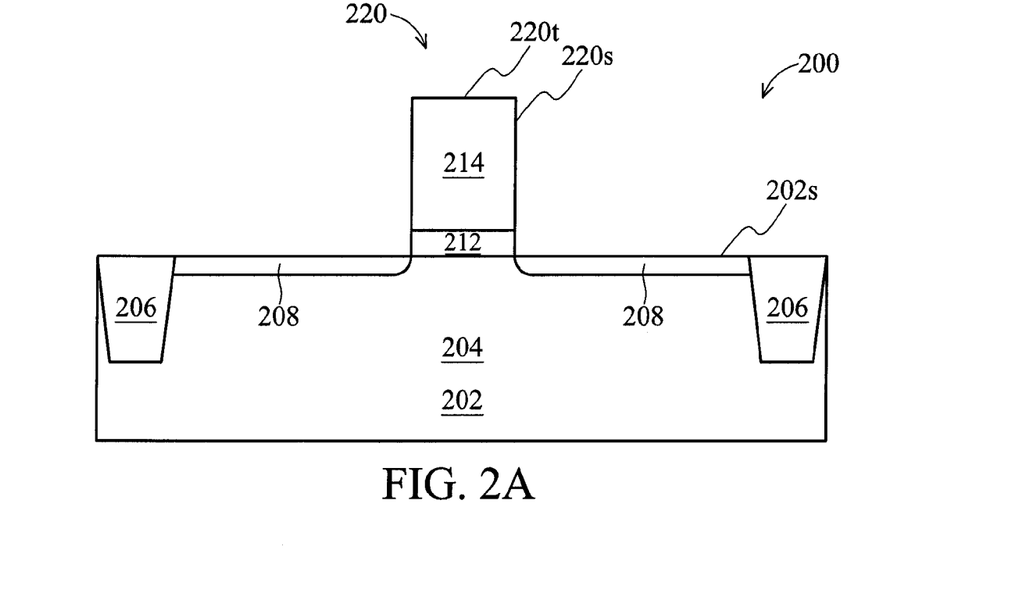
FIGS. 2A-H show schematic cross-sectional views of contact etch stop layers of a field effect transistor at various stages of fabrication according to various aspects of the present disclosure.

Referring to FIGS. 1 and 2A, the method 100 begins at step 102 wherein a gate structure 220 comprising sidewalls 220s and a top surface 220t over a substrate 202 is provided. In at least one embodiment, the substrate 202 may comprise a silicon substrate. In some alternative embodiments, the substrate 202 may comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI) or silicon on sapphire. In some other embodiments, the substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 202 may comprise a multilayer silicon structure or a silicon substrate may include a multilayer compound semiconductor structure. The substrate 202 comprises a surface 202s.

In some embodiments, the substrate 202 may further comprise active regions 204 and isolation regions 206. The active regions 204 may include various doping configurations depending on design requirements as known in the art. In some embodiments, the active region 204 may be doped with p-type or n-type dopants. For example, the active regions 204 may be doped with p-type dopants, such as boron or $BF_2$; n-type dopants, such as phosphorus or arsenic; and/or combinations thereof. The active regions 204 may be configured for an N-type metal-oxide-semiconductor transistor device (referred to as an NMOS), or alternatively configured for a P-type metal-oxide-semiconductor transistor device (referred to as a PMOS).

In some embodiments, the isolation regions 206 may be formed on the substrate 202 to isolate the various active regions 204. The isolation regions 206 may utilize isolation technology, such as local oxidation of silicon (LOCOS) or shallow trench isolation (STI), to define and electrically isolate the various active regions 204. In at least one embodiment, the isolation region 206 includes a STI. The isolation regions 206 may comprise silicon oxide, silicon nitride, silicon oxynitride, fluoride-doped silicate glass (FSG), a low-K dielectric material, other suitable materials, and/or combinations thereof. The isolation regions 206, and in the present embodiment, the STI, may be formed by any suitable process. As one example, the formation of the STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Then, a gate dielectric layer 212 is formed over the substrate 202. In some embodiments, the gate dielectric layer 212 may comprise silicon oxide, high-k dielectric material or combination thereof. A high-k dielectric material is defined as a dielectric material with a dielectric constant greater than that of $SiO_2$. The high-k dielectric layer comprises metal oxide. In some embodiments, the metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. The gate dielectric layer 212 may be grown by a thermal oxidation process, a chemical vapor deposition (CVD) process, an atomic layer deposition (ALD) process, and may have a thickness less than 2 nm.

In some embodiments, the gate dielectric layer 212 may further comprise an interfacial layer (not shown) to minimize stress between the gate dielectric layer 212 and the substrate 202. The interfacial layer may be formed of silicon oxide or silicon oxynitride grown by a thermal oxidation process. For example, the interfacial layer can be grown by a rapid thermal oxidation (RTO) process or in an annealing process comprising oxygen.

Then, a dummy gate electrode layer 214 may be formed over the gate dielectric layer 212. In some embodiments, the dummy gate electrode layer 214 may comprise a single layer or multilayer structure. In the present embodiment, the dummy gate electrode layer 214 may comprise poly-silicon. Further, the dummy gate electrode layer 214 may be doped poly-silicon with the uniform or gradient doping. The dummy gate electrode layer 214 may have any suitable thickness. In the present embodiment, the dummy gate electrode layer 214 has a thickness in the range of about 30 nm to about 60 nm. In some embodiments, the dummy gate electrode layer 214 may be formed using a low-pressure chemical vapor deposition (LPCVD) process. In at least one embodiment, the LPCVD process can be carried out in a LPCVD furnace at a temperature of about 580° C. to 650° C. and at a pressure of about 200 mTorr to 1 Torr, using silane ($SiH_4$), disilane ($Si_2H_6$), trisilane ($Si_3H_8$) or dichlorosilane ($SiH_2Cl_2$) as the silicon source gas.

And then, in some embodiments, a hard mask layer (not shown) may be formed over the dummy gate electrode layer 214 to protect the dummy gate electrode layer 214. The hard mask layer may include silicon nitride. The hard mask layer can be deposited by, for example, a CVD process, or a LPCVD process. The hard mask layer may have a thickness of about 100 to 400 Å. After the hard mask layer is deposited, the hard mask layer is patterned using a photo-sensitive layer (not shown). Then the gate structure 220 is patterned through the hard mask layer using a reactive ion etching (RIE) or a high density plasma (HDP) process, exposing a portion of the substrate 202, thereby the gate structure 220 comprises sidewalls 220s and a top surface 220t.

Also shown in FIG. 2A, in some embodiments, after formation of the gate structure 220, lightly doped source and drain (LDD) regions 208 may be created in the active region 204. This is accomplished via ion implantation of boron or phosphorous, at an energy between about 5 to 100 KeV, at a dose between about 1E11 to 1E 14 atoms/cm².

Figure 2B:
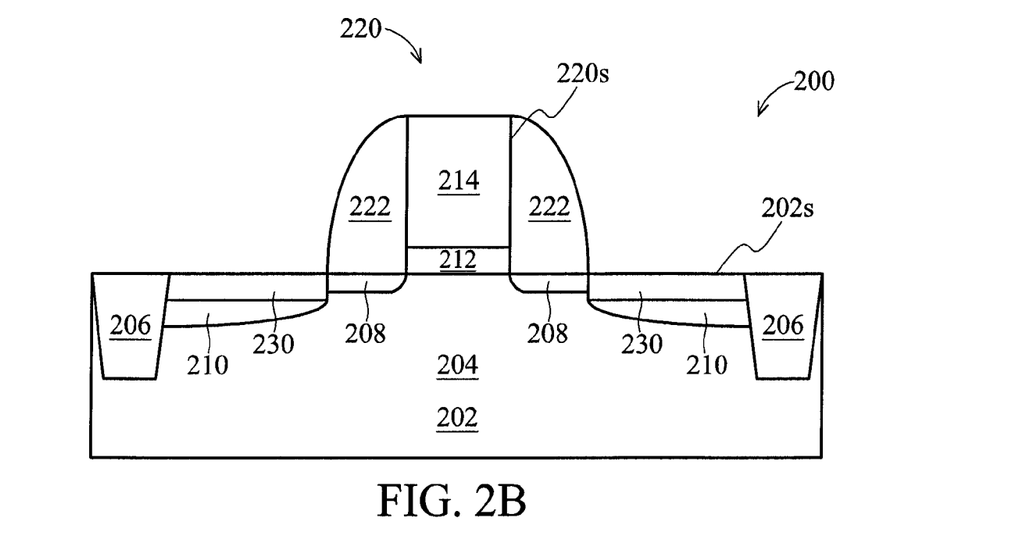

Referring to FIGS. 1 and 2B, the method 100 continues with step 104 in which a spacer 222 adjacent to the sidewalls 220s of the gate structure 220 is formed. The spacer 222 may be formed of silicon oxide, silicon nitride, silicon oxynitride, silicon carbide, fluoride-doped silicate glass (FSG), a low k dielectric material, and/or combinations thereof. The spacers 222 may have a multiple-layers structure, for example, including one or more liner layers. The liner layer may include a dielectric material such as silicon oxide, silicon nitride, and/or other suitable materials. The spacer 222 may be formed by methods including deposition of suitable dielectric material and anisotropically etching the material to form the spacer 222. A width of the spacer 222 may be in the range of about 6 to 35 nm.

Also shown in FIG. 2B is the creation of a plurality of heavily doped source and drain (S/D) regions 210 in the active region 204 needed for low resistance contact. This is achieved via ion implantation of boron or phosphorous, at an energy level between about 5 to 150 KeV, at a dose between about 1E15 to 1E 16 atoms/cm².

Still referring to FIGS. 1 and 2B, the method 100 continues with step 106 in which silicide regions 230 in the substrate 202 on sides of the gate structure 220 are formed. In some embodiments, the silicide regions 230 may be formed on the S/D regions 210 by a self-aligned silicide (salicide) process. For example, the salicide process may comprise 2 steps. First, a metal material may be deposited via sputtering to the substrate surface 202s at a temperature between 500° C. to 900° C., causing a reaction between the underlying silicon and metal material to form the silicide regions 230. And then, the un-reacted metal material may be etched away. The silicide regions 230 may comprise a material selected from titanium silicide, cobalt silicide, nickel silicide, platinum silicide, erbium silicide, or palladium silicide. A thickness of the silicide regions 230 is in the range of about 30 to 50 nm.

Figure 2C:
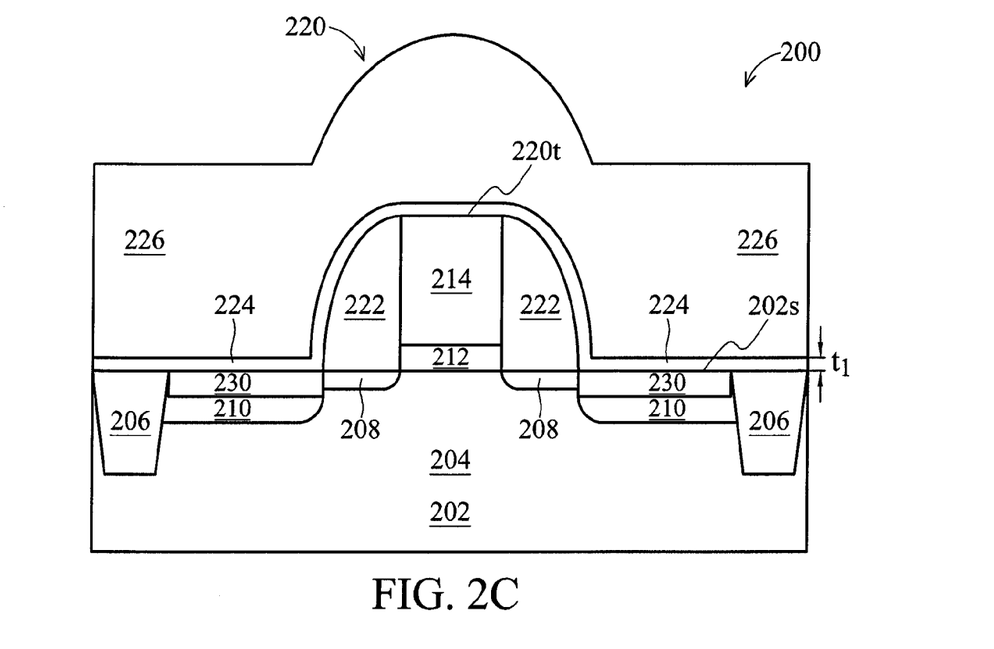

The method 100 in FIG. 1 continues with step 108 in which the structure in FIG. 2C is produced by depositing a first contact etch stop layer 224 over the spacer 222 and the top surface 220t of the gate structure 220 and extending along the surface 202s of the substrate 202. The first contact etch stop layer 224 may comprise, but is not limited to, silicon nitride or carbon-doped silicon nitride. The first contact etch stop layer 224 may have any suitable thickness. In some embodiments, the first contact etch stop layer 224 has a thickness $t_1$ in the range of about 180 to about 220 angstroms.

In some embodiments, the first contact etch stop layer 224 may be deposited using CVD, high density plasma (HDP) CVD, sub-atmospheric CVD (SACVD), molecular layer deposition (MLD), sputtering, or other suitable methods. For example, in some embodiments, the MLD process is generally carried out under a pressure less than 10 mTorr and in the temperature range from about 350° C. to 500° C. In at least one embodiment, the silicon nitride is deposited on the spacer 222 and the top surface 220t of the gate structure 220 by reacting a silicon source compound and a nitrogen source. The silicon source compound provides silicon to the deposited silicon nitride and may be silane ($SiH_4$) or tetrathoxysilane (TEOS). The nitrogen source provides nitrogen to the deposited silicon nitride and may be ammonia ($NH_3$) or nitrogen gas ($N_2$). In another embodiment, the carbon-doped silicon nitride is deposited on the spacer 222 and the top surface 220t of the gate structure 220 by reacting a carbon source compound, a silicon source compound, and a nitrogen source.

The carbon source compound may be an organic compound, such as a hydrocarbon compound, e.g., ethylene ($C_2H_6$).

The method 100 in FIG. 1 continues with step 110 in which the structure in FIG. 2C is produced by further depositing a first interlayer dielectric (ILD) layer 226 over the first contact etch stop layer 224. The first ILD layer 226 may comprise a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), polyimide, and/or combinations thereof. It is understood that the first ILD layer 226 may comprise one or more dielectric materials and/or one or more dielectric layers. In some embodiments, the first ILD layer 226 may be deposited over the first contact etch stop layer 224 to a suitable thickness by CVD, high density plasma (HDP) CVD, sub-atmospheric CVD (SACVD), spin-on, sputtering, or other suitable methods. In the present embodiment, the first ILD layer 226 comprises a thickness of about 3000 to 4500 Å.

Figure 2D:
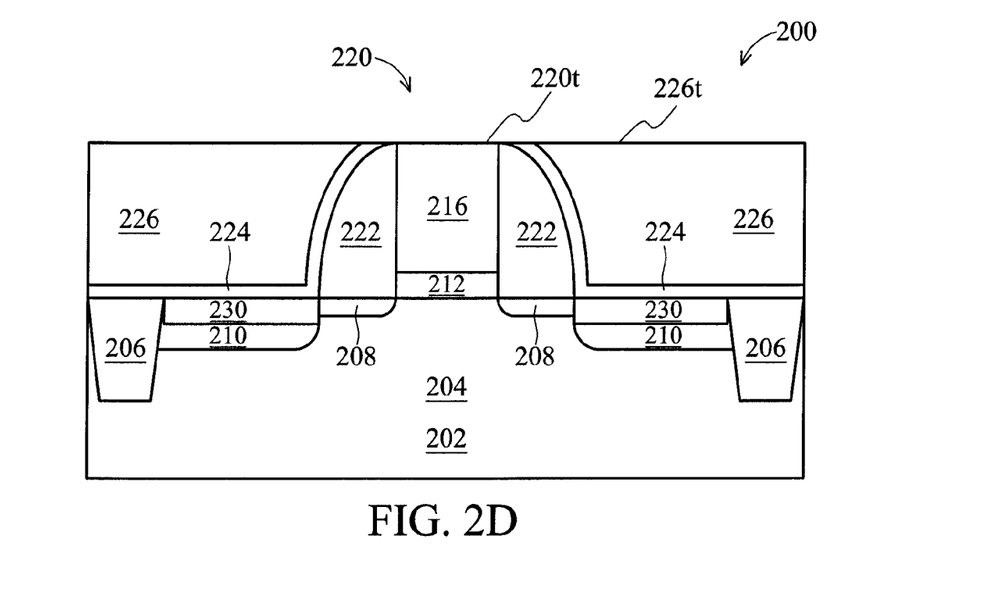

The method 100 in FIG. 1 continues with step 112 in which the structure in FIG. 2D is produced by performing a chemical mechanical polishing (CMP) on the first interlayer dielectric (ILD) layer 226 and first contact etch stop layer 224 to expose the top surface 220t of the gate structure 220. In a gate last process, the dummy gate electrode layer 214 may be removed so that a resulting metal gate electrode layer 216 may be formed in place of the dummy gate electrode layer 214. Accordingly, the ILD layer 226 is planarized using a CMP process until the top surface 220t of the dummy gate electrode layer 214 is exposed or reached. The CMP process may have a high selectivity to provide a substantially planar surface for the dummy gate electrode layer 214, spacer 222, first contact etch stop layer 224, and ILD layer 226. Thus, a top surface 226t of the ILD layer 226 is coplanar with the top surface 220t of the gate structure 220. The CMP process may also have low dishing and/or erosion effect. In some alternative embodiments, the CMP process may be performed to expose the hard mask layer and then an etching process such as a wet etch dip may be applied to remove the hard mask layer thereby exposing the top surface 220t of the dummy gate electrode layer 214.

After the CMP process, a gate replacement process is performed. The dummy gate electrode layer 214 may be removed from the gate structure 220 surrounded with dielectric comprising the spacer 222, first contact etch stop layer 224, and ILD layer 226. The dummy gate electrode layer 214 may be removed to form a trench in the gate structure 220 by any suitable process, including the processes described herein. In some embodiments, the dummy gate electrode layer 214 may be removed using a wet etch and/or a dry etch process. In at least one embodiment, the wet etch process for the dummy poly-silicon gate electrode layer 214 comprises exposure to a hydroxide containing solution (e.g., ammonium hydroxide), deionized water, and/or other suitable etchant solutions.

Next the dummy gate electrode layer 214 is removed, which results in the formation of a trench (not shown). A metal layer may be formed to fill in the trench. The metal layer may include any metal material suitable for forming a metal gate electrode layer 216 or portion thereof, including barriers, work function layers, liner layers, interface layers, seed layers, adhesion layers, barrier layers, etc. In some embodiments, the metal layer may include suitable metals, such as TiN, WN, TaN, or Ru that properly perform in the PMOS device. In some alternative embodiments, the metal layer may include suitable metals, such as Ti, Ag, Al, TiAl, TiAlN, TaC, TaCN, TaSiN, Mn, or Zr that properly perform in the NMOS device. Another CMP is performed on the metal layer to form the metal gate electrode layer 216 of the semiconductor devices 200. For simplicity and clarity, the metal gate electrode layer 216 and gate dielectric layer 212 are hereinafter also referred to as a gate structure 220.

Figure 2E:
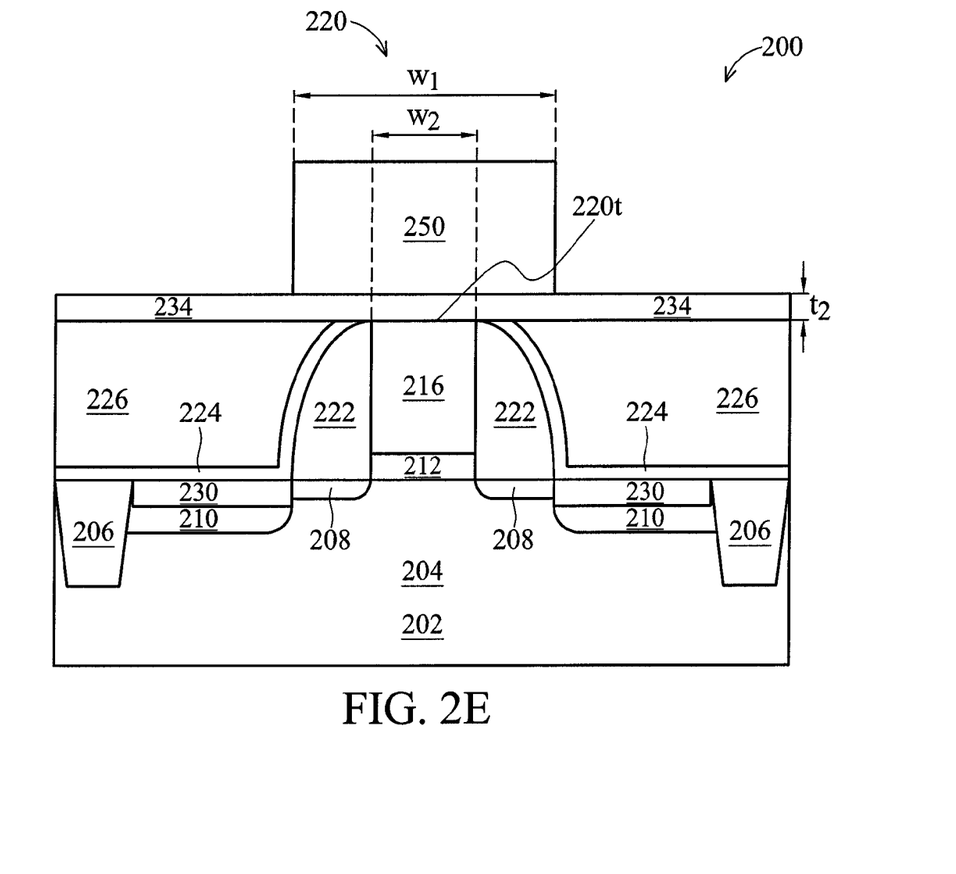

In some embodiments, it is desirable to protect the metal gate structure 220 from being damaged during contact etching. The method 100 in FIG. 1 continues with step 114 in which the structure in FIG. 2E is produced by depositing a second contact etch stop layer 234 over the first ILD layer 226 and the top surface 220t of the gate structure 220. The second contact etch stop layer 234 will protect the gate structure 220 during contact etching. The second contact etch stop layer 234 may comprise, but is not limited to, silicon nitride or carbon-doped silicon nitride. The second contact etch stop layer 234 may have any suitable thickness. In the present embodiment, the second contact etch stop layer 234 has a thickness $t_2$ in the range of about 190 to about 250 angstroms. In at least one embodiment, the thickness $t_1$ of the first contact etch stop layer 224 is less than the thickness $t_2$ of the second contact etch stop layer 234. In some embodiments, A ratio of the thickness $t_2$ of the second contact etch stop layer 234 to the thickness $t_1$ of the first contact etch stop layer 224 is from 1.05 to 1.15. In some other embodiment, a thickness $t_1$ of the first contact etch stop layer 224 may be greater than a thickness $t_2$ of the second contact etch stop layer 234 for capacitance reduction if some metal gate electrode layer 216 loss is acceptable.

In some embodiments, the second contact etch stop layer 234 may be deposited using CVD, high density plasma (HDP) CVD, sub-atmospheric CVD (SACVD), molecular layer deposition (MLD), sputtering, or other suitable methods. For example, in at least one embodiment, the MLD process is generally carried out under a pressure less than 10 mTorr and in the temperature range from about 350° C. to 500° C. In some embodiments, the silicon nitride is deposited on the ILD layer 226 and the top surface 220t of the gate structure 220 by reacting a silicon source compound and a nitrogen source. The silicon source compound provides silicon to the deposited silicon nitride and may be silane ($SiH_4$) or tetrathoxysilane (TEOS). The nitrogen source provides nitrogen to the deposited silicon nitride and may be ammonia ($NH_3$) or nitrogen gas ($N_2$). In some other embodiments, the carbon-doped silicon nitride is deposited on the ILD layer 226 and the top surface 220t of the gate structure 220 by reacting a carbon source compound, a silicon source compound, and a nitrogen source. The carbon source compound may be an organic compound, such as a hydrocarbon compound, e.g., ethylene ($C_2H_6$).

In the present embodiment, the first and second contact etch stop layers 224, 234 comprise the same material. In some alternative embodiments, the first and second contact etch stop layers 224, 234 comprise different materials. For example, in certain embodiments, the first contact etch stop layer 224 is silicon nitride, the second contact etch stop layer 234 is carbon-doped silicon nitride, and vice versa.

Then, a patterned photo-sensitive layer 250 is formed on the second contact etch stop layer 234. For example, the patterned photo-sensitive layer 250 may be formed using processes such as, spin-coating, photolithography processes including exposure, bake, and development processes, etching (including ashing or stripping processes), and/or other processes. The patterned photo-sensitive layer 250 is sensitive to particular exposure beam such KrF, ArF, EUV or e-beam light. In at least one example, the patterned photo-sensitive layer includes polymers, quencher, chromophore, solvent and/or chemical amplifier (CA). In the present embodiment, the patterned photo-sensitive layer 250 exposes a portion of the silicide regions 230 for contact formation in the S/D regions 210. The width $W_1$ of photo-sensitive layer 250 is greater than a width $W_2$ of the gate structure 220.

Figure 2F:
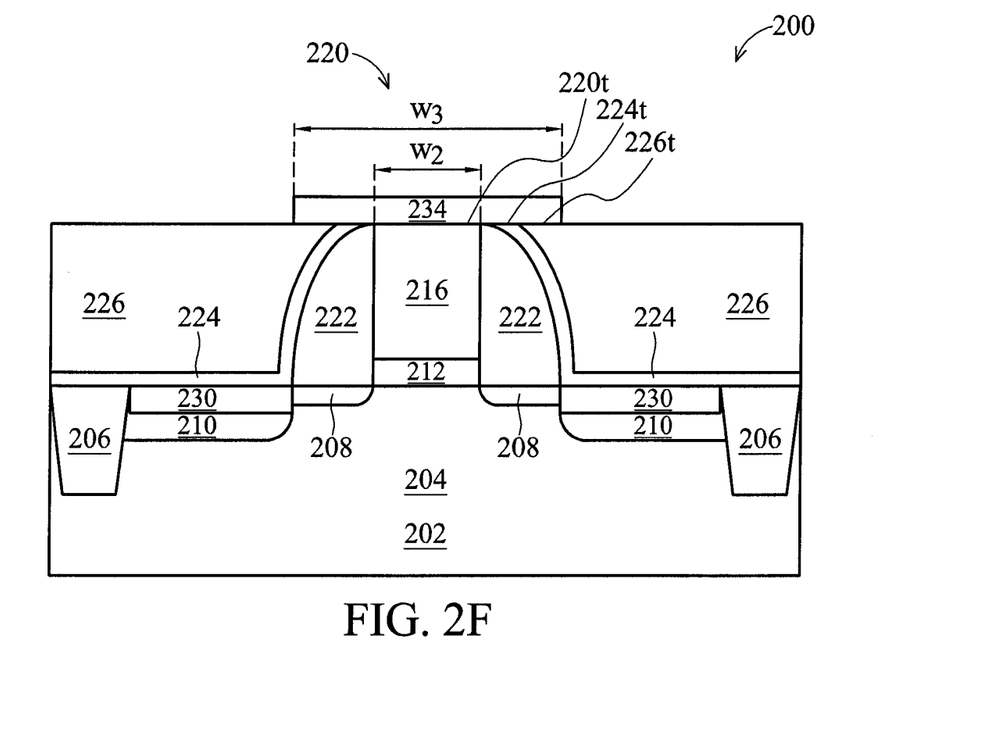

The method 100 in FIG. 1 continues with step 116 in which the structure in FIG. 2F is produced by patterning the second contact etch stop layer 234 to remove a portion of the second contact etch stop layer 234 over the silicide regions 230, whereby the second contact etch stop layer 234 remains over the gate structure 220 but does not extend as far as up to the silicide regions 230. In some embodiments, the second contact etch stop layer 234 is patterned through the photo-sensitive layer 250 using a dry etching process, exposing a portion of the ILD layer 226, thereby a width $W_3$ of second contact etch stop layer 234 is greater than the width $W_2$ of the gate structure 220. The dry etching process may have a high selectivity such that the dry etching process may stop at the ILD layer 226. For example, the dry etching process may be performed under a source power of about 150 to 220 W, and a pressure of about 10 to 45 mTorr, using $CH_2F_2$ and Ar as etching gases.

In the present embodiment, the second contact etch stop layer 234 comprises a portion extending on the top surface 220t of the gate structure 220. The second contact etch stop layer 234 in this embodiment further comprises a portion extending on a top surface 224t of the first contact etch stop layer 224. The second contact etch stop layer 234 in this embodiment further comprises a portion extending on the top surface 226t of the ILD layer 226.

Figure 2G:
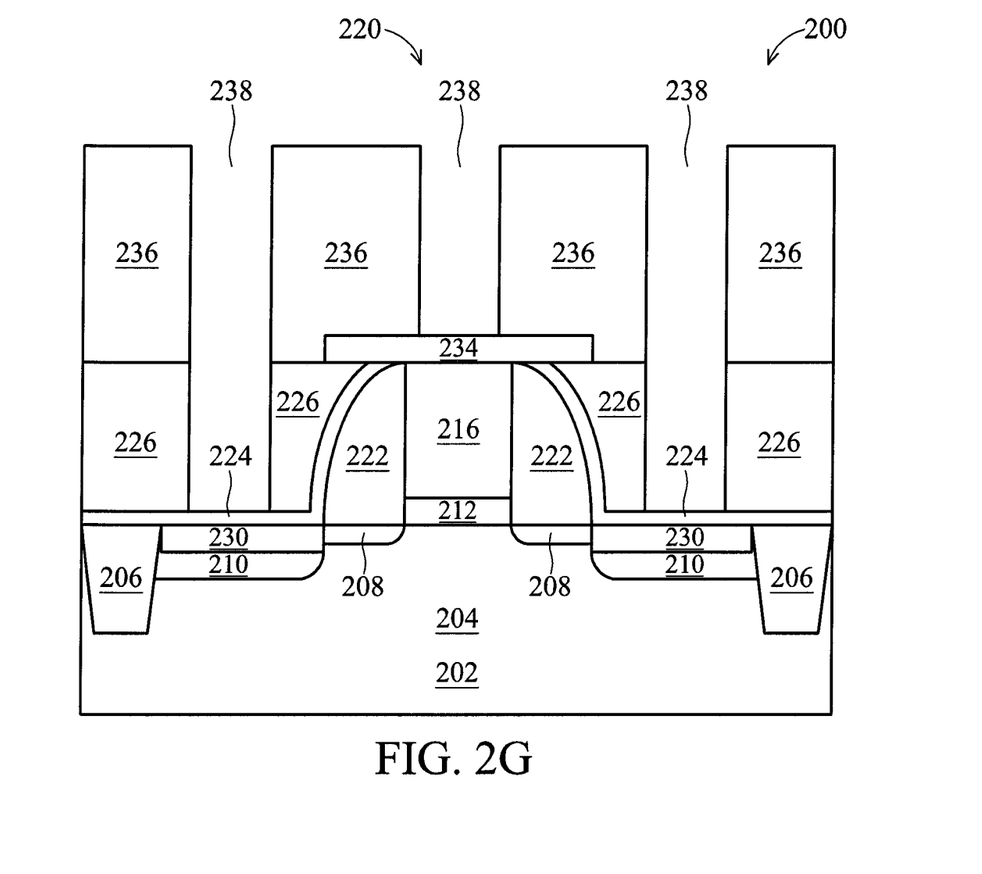
Figure 2H:
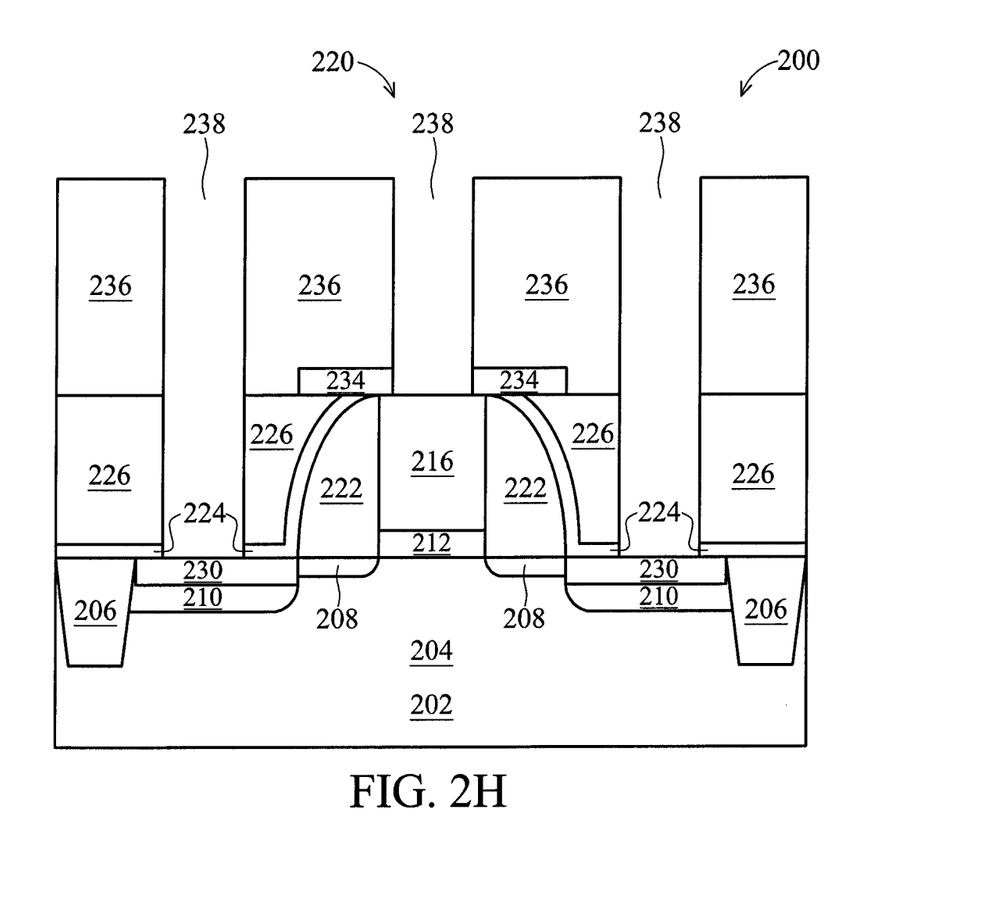

Subsequent CMOS processing steps applied to the semiconductor device 200 of FIG. 2F may comprise forming contact holes through the first and second contact etch stop layers 224, 234 to provide electrical contacts to the gate structure 220 and/or S/D regions 210. Referring to FIG. 2G, contact holes 238 may be formed by any suitable process. As one example, the formation of the contact holes 238 may include depositing a second interlayer dielectric (ILD) layer 236 over the first ILD layer 226 and second contact etch stop layer 234, patterning the second ILD layer 236 by a photolithography process, etching the exposed second ILD layer 236 (for example, by using a dry etching, wet etching, and/or plasma etching process) to remove portions of the second interlayer dielectric layer 236 over a portion of the silicide region 230 and a portion of the gate structure 220 to expose portions of the first and second contact etch stop layers 224, 234.

In the present embodiment, the second ILD layer 236 may comprise a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), polyimide, and/or combinations thereof. It is understood that the second ILD layer 236 may comprise one or more dielectric materials and/or one or more dielectric layers. In some embodiments, the second ILD layer 236 may be deposited over the first ILD layer 226 and second contact etch stop layers 234 to a suitable thickness by CVD, HDP CVD, SACVD, spin-on, sputtering, or other suitable methods. In the present embodiment, the second ILD layer 236 comprises a thickness of about 3000 to 4500 Å.

Referring to FIG. 2H, the exposed portions of the first and second contact etch stop layers 224, 234 are removed to expose the gate structure 220 and silicide region 230. In the present embodiment, the first and second contact etch stop layers 224, 234 are simultaneously removed using a dry etching process. The dry etching process may have a high selectivity such that the dry etching process may stop at the gate structure 220 and silicide region 230. For example, the dry etching process may be performed under a source power of about 150 to 220 W, and a pressure of about 10 to 45 mTorr, using $CH_2F_2$ and Ar as etching gases. Therefore, unwanted etching of the metal gate structure 220 may be reduced during contact etching due to the introduction of the second contact etch stop layer 234 over the metal gate structure 220. Accordingly, the disclosed methods of fabricating contact etch stop layers of the semiconductor device 200 may fabricate a metal gate structure 220 without a recess caused by the contact etch, thereby enhancing the device performance.

Then, in some embodiments, subsequent processes, including interconnect processing, are performed after forming the semiconductor device 200 to complete the IC fabrication.

While the invention has been described by way of example and in terms of the various embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate metal gate structures for a semiconductor device. In this way, metal gate structures with less recess for a semiconductor device may be formed.

What is claimed is:

1. A method for fabricating a field-effect transistor, comprising:
   providing a gate structure comprising sidewalls and a top surface over a substrate;
   forming a spacer adjacent to the sidewalls of the gate structure;
   forming silicide regions in the substrate on sides of the gate structure;
   depositing a first contact etch stop layer over the spacer and the top surface of the gate structure;
   depositing a first interlayer dielectric layer over the first contact etch stop layer;
   performing a chemical mechanical polishing on the first interlayer dielectric layer and first contact etch stop layer to expose the gate structure;
   depositing a second contact etch stop layer over the first interlayer dielectric layer and the top surface of the gate structure; and
   patterning the second contact etch stop layer to remove a portion of the second contact etch stop layer over the silicide regions, whereby the second contact etch stop layer remains over the gate structure but does not extend as far as up to the silicide regions.

2. The method of claim 1, wherein the second contact etch stop layer further comprises a portion extending on a top surface of the first contact etch stop layer.

3. The method of claim 1, wherein the second contact etch stop layer further comprises a portion extending on a top surface of the first interlayer dielectric layer.

4. The method of claim 1, wherein the second contact etch stop layer comprises silicon oxide or silicon oxy-nitride.

5. The method of claim 1, wherein a thickness of the second contact etch stop layer is in the range of about 190 to 250 angstroms.

6. The method of claim 1, wherein a thickness of the first contact etch stop layer is less than a thickness of the second contact etch stop layer.

7. The method of claim 1 further comprising
depositing a second interlayer dielectric layer over the first interlayer dielectric layer and second contact etch stop layer; and
patterning the second interlayer dielectric layer to remove portions of the second interlayer dielectric layer over a portion of the silicide region and a portion of the gate structure to expose portions of the first and second contact etch stop layers.

8. The method of claim 7 further comprising
removing the exposed portions of the first and second contact etch stop layers to expose the gate structure and silicide region.

9. The method of claim 8, wherein the removing the exposed portions of the first and second contact etch stop layers to expose the gate structure and silicide regions are performed simultaneously.

10. The method of claim 1, wherein the first contact etch stop layer is formed to have a first thickness, the second contact etch stop layer is formed to have a second thickness, and a ratio of the second thickness to the first thickness is set to range from 1.05 to 1.15.

11. A method for fabricating a transistor, comprising:
forming a first contact etch stop layer over a top surface of a gate structure, a spacer adjacent to a sidewall of the gate structure, and a source/drain region adjacent to the spacer;
forming a silicide region on the source/drain region;
forming a first interlayer dielectric layer over the first contact etch stop layer;
performing a chemical mechanical polishing on the first interlayer dielectric layer and the first contact etch stop layer to expose the gate structure;
forming a second contact etch stop layer over the first interlayer dielectric layer and the top surface of the gate structure; and
patterning the second contact etch stop layer to remove a portion of the second contact etch stop layer, the portion of the second contact etch stop layer being directly over the source/drain region and exposing substantially an entirety of the silicide region.

12. The method of claim 10, wherein the first contact etch stop layer is formed to have a thickness ranging from 180 to 220 angstroms.

13. The method of claim 10, wherein the second contact etch stop layer is formed to have a thickness ranging from 190 to 250 angstroms.

14. The method of claim 10, wherein the first contact etch stop layer is formed to have a first thickness, the second contact etch stop layer is formed to have a second thickness, and a ratio of the second thickness to the first thickness is set to range from 1.05 to 1.15.

15. The method of claim 10, wherein patterning the second contact etch stop layer comprises:
forming a patterned photo-sensitive layer exposing the portion of the second contact etch stop layer; and
performing an etching process to remove the portion of the second contact etch stop layer.

16. The method of claim 10, further comprising:
forming a second interlayer dielectric layer over the first interlayer dielectric layer and the patterned second contact etch stop layer;
patterning the second interlayer dielectric layer to expose a portion of the patterned second contact etch stop layer; and
patterning the first interlayer dielectric layer to expose a portion of the first contact etch stop layer.

17. The method of claim 16, further comprising:
removing the exposed portion of the first contact etch stop layer and the exposed portion of the second contact etch stop layer.

18. A method for fabricating a transistor, comprising:
forming a first contact etch stop layer over a gate structure of the transistor and a source/drain region of the transistor, the gate structure comprising a dummy gate electrode;
forming a silicide region on the source/drain region;
forming a first interlayer dielectric layer over the first contact etch stop layer;
performing a planarization process on the first interlayer dielectric layer and the first contact etch stop layer to expose the dummy gate electrode;
replacing the dummy gate electrode with a metal gate electrode;
forming a second contact etch stop layer over the first interlayer dielectric layer and a top surface of the metal gate electrode; and
patterning the second contact etch stop layer to remove a portion of the second contact etch stop layer, the patterned second contact etch stop layer covering the metal gate electrode and exposing substantially an entirety of the silicide region.

19. The method of claim 18, further comprising:
forming a second interlayer dielectric layer over the first interlayer dielectric layer and the patterned second contact etch stop layer;
patterning the second interlayer dielectric layer to expose a portion of the patterned second contact etch stop layer; and
patterning the first interlayer dielectric layer to expose a portion of the first contact etch stop layer over the source/drain region.

20. The method of claim 19, further comprising:
removing the exposed portion of the first contact etch stop layer and the exposed portion of the second contact etch stop layer.

* * * * *